United States Patent
Yuenyongsgool et al.

(10) Patent No.: US 9,429,980 B2
(45) Date of Patent: Aug. 30, 2016

(54) FLEXIBLE CLOCKING FOR AUDIO SAMPLE RATE CONVERTER IN A USB SYSTEM

(71) Applicant: Microchip Technology Incorporated, Chandler, AZ (US)

(72) Inventors: Yong Yuenyongsgool, Gilbert, AZ (US); Igor Wojewoda, Tempe, AZ (US); Sergey Pavlov, Chandler, AZ (US); Anton Alkhimenok, Phoenix, AZ (US); Kim Otten, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 179 days.

(21) Appl. No.: 14/202,517

(22) Filed: Mar. 10, 2014

(65) Prior Publication Data
US 2014/0270253 A1    Sep. 18, 2014

Related U.S. Application Data

(60) Provisional application No. 61/784,160, filed on Mar. 14, 2013.

(51) Int. Cl.
*G06F 17/00*    (2006.01)
*G06F 1/04*    (2006.01)
*G06F 1/10*    (2006.01)
*H03H 17/06*    (2006.01)

(52) U.S. Cl.
CPC . *G06F 1/04* (2013.01); *G06F 1/10* (2013.01); *H03H 17/0642* (2013.01)

(58) Field of Classification Search
CPC ............. H03H 17/0416; H03H 17/0422; H03H 17/0621; H03M 3/494; G06F 1/04; G06F 1/06; G06F 1/12
See application file for complete search history.

(56) References Cited

U.S. PATENT DOCUMENTS

| | | | | |
|---|---|---|---|---|
| 5,875,354 A * | 2/1999 | Charlton | ................... | G06F 5/06 710/61 |
| 6,642,863 B1 * | 11/2003 | Venkitachalam | .. | H03H 17/0685 341/61 |
| 7,826,578 B1 * | 11/2010 | Melanson | ................. | G06F 1/12 370/458 |
| 2003/0026368 A1 | 2/2003 | Subramoniam et al. | ..... | 375/354 |
| 2004/0187043 A1 * | 9/2004 | Swenson | ................... | G06F 1/12 713/400 |
| 2006/0083393 A1 * | 4/2006 | Richenstein | ........... | H04H 20/62 381/302 |
| 2011/0179099 A1 | 7/2011 | Hu et al. | ....................... | 708/290 |

OTHER PUBLICATIONS

International Search Report and Written Opinion, Application No. PCT/US2014/023349, 11 pages, Jun. 26, 2014.

* cited by examiner

*Primary Examiner* — Andrew C Flanders
(74) *Attorney, Agent, or Firm* — Slayden Grubert Beard PLLC

(57) ABSTRACT

A processor according to embodiments comprises an on-board sample rate converter for converting a source audio signal that is sampled at a first sampling rate to an output audio signal that is sampled at a second sampling rate. The sample rate converter utilizes a master clock signal in converting the audio signal. The sample rate converter selects the master clock signal from available reference clock signals, such as an on-chip system clock or a bus interface clock, and scales the frequency of the selected clock signal to generate the master clock signal with the frequency of the second sampling rate.

20 Claims, 3 Drawing Sheets

FLEXIBLE CLOCKING FOR AUDIO SAMPLE RATE CONVERTER IN A USB SYSTEM

CROSS-REFERENCE TO RELATED APPLICATIONS

This application claims the benefit of U.S. Provisional Application No. 61/784,160 filed on Mar. 14, 2013, which is incorporated herein in its entirety.

TECHNICAL FIELD

The present disclosure relates to sample rate conversion and, particularly, to flexible clocking for an audio sample rate converter.

BACKGROUND

Universal Serial Bus (USB) was developed to offer PC users a standardized interface for connecting many different types of peripheral devices to their computers. The development of USB was initially driven by the constraints of laptop computers, which provided limited space for peripheral connection ports, but were expected to interface with a an evolving set of personal electronic devices. Providing specialized ports for a broad range of peripheral devices is infeasible for desktop PCs and practically impossible for laptop PCs. Consequently, laptops benefited greatly from a standardized, small-profile peripheral connection port that could be used for coupling many different types of peripherals. USB eliminates the need for a PC to provide different ports for various printers, keyboards, mice, and other peripherals. The common and straightforward interface provided by USB has become increasingly important with the proliferation of personal mobile devices.

In providing connectivity for a variety of peripheral devices, USB supports the transfer of a variety of data types, from relatively slow mouse inputs to digitized streaming audio and video. The capabilities of the USB interface are defined by a widely-adopted specification developed jointly by PC, peripheral and software manufacturers. USB has become the hardware interface of choice for PC peripherals because it offers users standardized and straightforward connectivity and it supports connectivity for a variety of peripheral devices. Consequently, USB has proliferated beyond being a hardware interface for PC peripherals and is now a common interface for a wide variety of personal electronic devices ranging from cell phones to car stereos to alarm clocks.

Until relatively recently, the roles of USB participants were strictly defined as either USB hosts or USB devices, with USB devices being either peripheral devices or hubs. A USB host was restricted to that role, which requires the host to support several functions, including detecting the connection status of USB devices, managing error-free data flow with connected USB devices, and providing power to connected USB devices. Conversely, a USB device was limited to responding to request from a USB host. Importantly, two USB devices could not communicate with each other directly. USB devices were limited to communicating with a USB host.

More recently, greater interoperability between USB-enabled devices is supported by the On-the-Go (OTG) addition to the USB specification. OTG expands the USB specification to allow traditional USB devices to be configured to serve as limited-purpose USB host. Thus, a USB-enabled device can serve as either a USB host or a USB device, but cannot serve both roles at the same time. For example, the conventional USB specification allows a PC laptop to serve as a USB host when connected to a USB peripheral device, such as mobile phone. Per conventional USB, the mobile phone could serve only as a peripheral USB device and could not also serve as a USB host to other USB devices. The OTG addition to USB specification allows a peripheral USB device to also serve as a USB host to other peripheral USB devices. For example, the mobile phone would be peripheral USB device with respect to the laptop but could be disconnected from the laptop USB host and the mobile phone could instead be configured to serve as a USB host to a digital camera USB peripheral device. With the traditional roles of USB host and peripheral device less rigidly defined per the OTG addition to the USB specification, a wider variety of USB couplings has resulted. Modern USB devices are designed for interoperability with an increasingly large set of other USB devices as users become accustomed to an increasingly diverse set of USB devices being able to communicate with each other via USB.

Two types of devices that commonly utilize OTG are digital audio players and mobile telephones equipped with USB couplings, robust audio storage and streaming playback capabilities. Users can stream audio data from a mobile phone device for playback by a digital audio player via a USB coupling between the two devices. In order to provide these audio capabilities, such devices include one or more audio codecs.

In order to transmit and play audio data, devices must convert between analog and digital versions of the audio signal. Conversion of an analog source signal to digital representation of the signal involves sampling the analog source signal. Codecs are the hardware and/or software components of an electronic device that convert audio signal between analog and digital formats. Codecs are typically two-way components that include both analog-to-digital and digital-to-analog conversion capabilities. When converting an analog source signal to a digital signal, a codec samples the analog signal on a periodic basis and encodes each sample into a discrete set of digital information. The frequency at which the codec samples the analog source signal is referred to as the sampling rate. With a higher sample rate, more frequent digital encoding of the analog signal occurs and more digital information is generated per unit of time.

A codec typically supports multiple sampling rates. The selection of a sampling rate to be used by a codec in converting analog to digital audio data commonly seeks to balance the desire for high-fidelity audio and the need to generate manageable amounts for digital information. High-fidelity audio is usually preferred over lower-fidelity audio since it preserves more of the audio information present in the original analog source signal. However, higher-fidelity audio requires sampling at higher frequencies and thus generates more digital data than a lower-fidelity sample. Since the digital audio data needs to be stored and transmitted, the amount of the available capacity for storing the digital signal and the bandwidth available for transmitting the digital signal are factors that impact the selection of a sample rate.

A common use of USB-enabled devices is to stream audio data between the devices. When used in the fashion, the device on which the audio data is stored is a USB host. The host device retrieves stored audio data and streams it to the recipient USB device via the USB coupling. Since the audio data is stored on the USB host, it is preserved at a sample rate that is compatible with the audio codecs of the host and which meets the fidelity and storage space requirements of the host user. The sample rate of audio data stored on the USB host is also dictated at least in part by the use of the audio data. For example, CD audio data is sampled at 44.1 kHz, most professional audio and video equipment samples at 48 kHz and DVD and Blu-ray are both sampled at 96 kHz.

In light of the fact that USB-capable devices are highly diverse in terms of storage capacity and data transmission capabilities and constraints, USB devices utilize a variety of sample rates for converting analog audio source signals to digital data. With the proliferation of USB-enabled devices that support OTG, users are increasingly afforded the opportunity to couple a wider variety of USB devices together. Coupled USB devices are commonly used to stream audio data between the devices via the USB coupling. When coupled USB devices interoperate in this fashion, a problem arises when the digital audio signal being streamed from the USB source device is sampled a different rate than what is required for playback by the USB receiving device.

Thus arises the need to convert the sampling rate of the digital signal according to the requirements of the receiving device. Sample rate conversion is the process of converting a digital audio signal from one sample rate to another, while altering the signal as little as possible.

In order to implement a sample rate converter, a clock signal is needed that can operate at the frequency (i.e., sample rate) desired for the converted digital audio signal. It is also desirable to oversample the converted digital audio signal because oversampling facilitates easier conversion of the digital signal back to an analog signal. Occasionally, the need to down sample the source signal (i.e., generate an output with a lower sample frequency than the source signal) is also present. Consequently, a sample rate converter requires a clock signal that operates at a configurable frequency according to the needs of individual conversions.

In order to generate the clock signal for a sample rate converter, prior art systems are known to utilize conversion circuitry present externally from the microcontroller of the audio codec. In such systems, the sample rate converter operates according to a clock signal available outside the microcontroller. Such systems that utilize external sample rate converters are disfavored because of the increased manufacturing costs and complexity when compared to a sample rate converter present within the audio codec microcontroller circuitry. At minimum, an external sample rate converter must be able to communicate data with the audio codec microcontroller. Most commonly, this requires a dedicated, hardwired connection between the two components, which increasing manufacturing costs and complexity.

Prior art audio codecs are also known to implement source code converters using a clock signal provided by a dedicated crystal oscillator. A dedicated crystal oscillator provides the source code converter with a great degree of configurability and accuracy. However, the addition of a crystal oscillator dedicated for use by the sample rate converter again adds significant manufacturing cost and complexity and also increases the power consumption of the device.

Prior art audio codecs are also known to utilize sample rate converters implemented using a dedicated phase-locked loop (PLL) circuit to recover a clock signal from an existing signal. A dedicated PLL circuit for use by a sample rate converter again adds significant manufacturing cost and complexity and also increases the power consumption of the device.

Accordingly, a sample rate converter is desired that can accommodate a range of sampling rates that utilizes existing clock signals instead of dedicated clock recovery or clock generation components.

SUMMARY

Conventional sample rate converters require dedicated clocking mechanisms as part of the conversion subsystem. Hence, there is a need for a sample rate converter that can utilize existing clock signals and can be configured to provide a wide range of clock frequencies. These and other drawbacks in the prior art are overcome in large part by a system and method according to embodiments of the present invention.

According to an embodiment, a microcontroller comprising an on-chip sample rate converter, wherein the sample rate converter receives a source audio signal that is sampled at a first sampling rate, and wherein the sample rate converter generates an output audio signal sampled at a second sampling rate, and wherein the sample rate converter utilizes a master clock signal in converting the sample rate of the audio signal. The microcontroller further comprising a master clock circuit configured to generate the master clock signal wherein the master clock circuit selects from an on-chip system clock signal or a bus interface clock signal and scales the frequency of the selected clock signal to generate the master clock signal with the frequency of the second sampling rate.

According to a further embodiment, a first circuit of the microcontroller is configured to provide the bus interface clock signal wherein the bus interface clock signal is recovered from a digital signal. According to a further embodiment, the first circuit of the microcontroller is configured to recover the bus interface clock signal using a phase-lock loop clock recovery circuit. According to a further embodiment, the bus interface clock signal is recovered by the phase-lock loop circuit is a USB infrastructure clock signal. According to a further embodiment, the microcontroller further comprises a second circuit configured to provide the on-chip system clock signal wherein the on-chip system clock signal is generated by an RC oscillator circuit. According to a further embodiment, the microcontroller further comprises a third circuit configured to provide a reference clock signal wherein the reference clock signal is recovered from the source audio signal, wherein the a master clock circuit is further configured to generate the master clock signal by selecting from the on-chip system clock signal, the bus interface clock signal or the reference clock signal. According to a further embodiment, the source audio signal is streaming audio received by the system via a USB interface. According to a further embodiment, the microcontroller further comprises a bus interface wherein the bus interface is an Integrated Interchip Sound bus that provides the master clock signal to components external to the system.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

Figure 1:
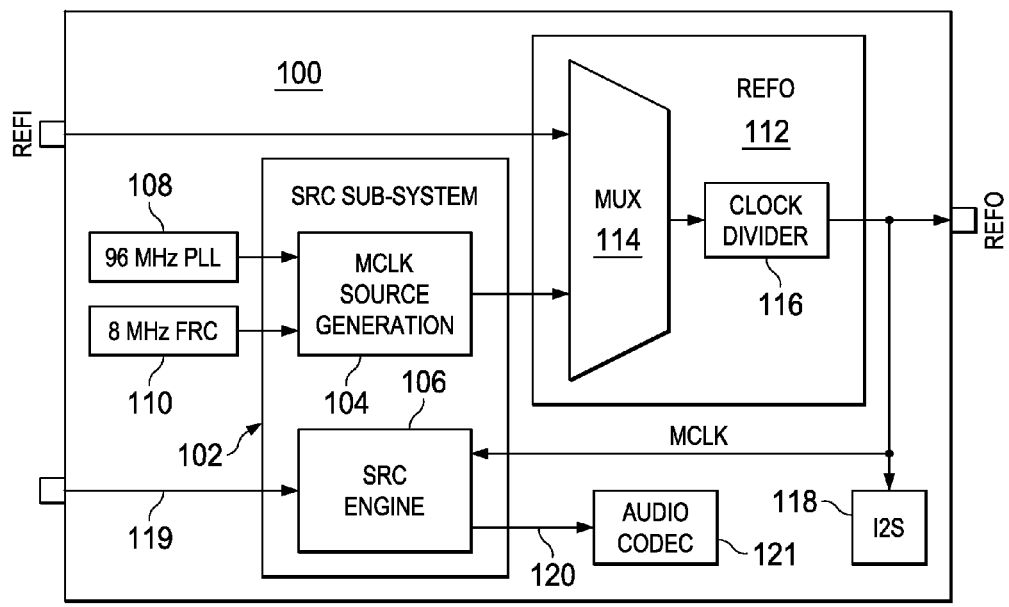
FIG. 1 is a block diagram of an exemplary clock system according to embodiments.

The disclosure and various features and advantageous details thereof are explained more fully with reference to the exemplary, and therefore non-limiting, embodiments illustrated in the accompanying drawings and detailed in the following description. Descriptions of known programming techniques, computer software, hardware, operating platforms and protocols may be omitted so as not to unnecessarily obscure the disclosure in detail. It should be understood, however, that the detailed description and the specific examples, while indicating the preferred embodiments, are given by way of illustration only and not by way of limitation. Various substitutions, modifications, additions and/or rearrangements within the spirit and/or scope of the underlying inventive concept will become apparent to those skilled in the art from this disclosure.

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms.

As will be explained in greater detail below, embodiments include a circuitry configured with an on-board sample rate converter (SRC) that operates using a configurable clock signal generated from existing clock signals. As described, SRCs have clock frequency requirements that vary according to the constrains of a particular conversion. However, two of the most common frequencies required by a SRC clock signal are 12.288 MHz and 24.576 MHz since these are the oversampled frequencies used to encode digital audio and DVD's, respectively. Digital audio is commonly sampled at 48 kHz and oversampled by a factor of 256 for transmission, which results in the need for a 12.288 MHz clock signal to process this oversampled audio signal. DVD audio is commonly sampled at 96 kHz and also oversampled by a factor of 256, which results in the need for a 24.576 MHz clock signal.

Clock signals with these frequencies are not typically available within a USB device. For instance, a typical USB device such as a microcontroller with a USB interface, might include a 96 MHz clock signal available for use by the USB infrastructure and an 8 MHz clock available from an on-chip, non-crystal tunable oscillator. A typical device also includes at least one crystal oscillator that serves as the main system clock. The frequency of this oscillator can usually be configured, but its operating frequency is selected based on the needs of the device as a whole and thus is not suitable for configuring according to the needs of the SRC.

Rather than utilize a dedicated clock recovery circuit, such as a PLL, or a dedicated oscillator, embodiments derive a clock for the SRC from the already available 96 MHz, 8 MHz or crystal oscillator reference clock signals.

Turning now to FIG. 1, a diagram schematically illustrating a flexible clocking system for a SRC according to embodiments is shown. The flexible clocking system 100 receives a reference oscillator signal (REFI) and outputs a clock signal (REFO) that has been configured to the desired sampling frequency to be used by the SRC in converting the sample rate of the source audio signal 119. In one embodiment, the REFI signal is the reference clock signal. The REFI signal may be derived from any number of sources. In some embodiments the REFI signal will be the primary crystal oscillator that provides the main system clock for driving the USB device. In this scenario, the REFI signal provides the flexible clocking system with an accurate reference signal on which to base its generated output clock signal REFO. In other embodiments, the REFI clock signal may be a recovered from the source audio signal. In other embodiments, the REFI clock signal may be provided by any user-provided clock source.

The flexible clocking system 100 includes an SRC subsystem 102 which is comprised of a master clock (MCLK) generation module 104 and a SRC engine 106. As will be explained in greater detail, the MCLK generation module 104 generates a master clock based on clock signals available to the SRC and audio codec circuit. The SRC engine 106 implements the actual sample rate conversion using the output clock signal REFO generated by the flexible clocking system.

In certain embodiments, one of the clock signals used as an input to the MCLK generation module 104 is a 96 MHz signal generated by a phase-locked loop (PLL) circuit that is commonly present within USB devices. The PLL circuit that generates the 96 MHz signal may recover a clock signal from an external data stream received by the USB device. For example, this data stream from which a clock signal is recovered by the PLL may be the source audio signal 119 that is being received by the USB device and that is being converted to a different sample rate. In this scenario, the frequency of the clock signal would be recovered by the PLL would be the sample rate of the source audio signal 119 that is being converted by the SRC engine 106. This PLL circuit may also generate a clock signal based on a reference clock available within the microcontroller. The PLL circuit may be configurable such that it can output a clock signal of a different frequency from the clock signal recovered from the external data stream. It should be noted however, that this PLL circuit is not dedicated to the SRC or the audio codec and would not be expected to generate a clock signal suitable for direct use by the SRC engine.

In certain embodiments that are comprised within USB devices, this PLL circuit is a common part of the USB hardware infrastructure used for generating a system clock for driving circuits that comprise the USB system. For high-speed USB devices, this PLL circuit is used to generate a 96 MHz USB system clock. For low-speed USB devices, this PLL circuit would generate a 48 MHz USB system clock. It is noted, however, that the frequency values discussed herein are exemplary only.

In certain embodiments, the other clock signal used as an input to the MCLK generation module 104 is generated by an internal Fast Resistor Capacitor (FRC) circuit. Unlike a PLL circuit that recovers a clock signal from an external data stream, an FRC circuit generates a clock signal based on an oscillating signal generated using an RC circuit. The FRC circuit does not utilize a crystal or ceramic oscillator. A common FRC circuit available in USB devices provides an 8 MHz clock signal that is used to drive the sequential logic of the device while the device powers up and begins receiving external data streams and/or clock signals. An FRC circuit can also provide a configurable clock signal by utilizing variable capacitors that can be used to tune the frequency of the clock signal that is generated.

In some embodiments, the frequency of this clock signal is configured via a set of tuning bits that specify the frequency of the clock signal output by the FRC. In some embodiments, the range of frequencies that can be generated using an FRC can be further calibrated using additional tuning bits that widens the scope of frequencies that can be produced using the FRC.

The MCLK generation module 104 selects from either the clock signals recovered by the PLL 108 or the clock signal generated using the FRC 110. The output of the MCLK source generation module 104 is provided to a multiplexer 114 in REFO module 112. Multiplexer 114 selects between the clock signal provided by the MCLK generation module and the REFI reference oscillator signal.

The clock signal selected as the output of multiplexer 114 is provided to a clock divider 116. This clock divider 116 is responsible for converting the clock signal selected by multiplexer 114 into a clock signal of the frequency required by the SRC engine. In other words, the clock divider generates a clock signal at the frequency of the desired converted sample rate. A clock divider is also commonly known as a prescaler because it alters the frequency scale of the input clock signal in generating an output clock signal of a different frequency. In certain embodiments, the clock divider 116 may be a FM16X clock divider which is capable of providing, for example, 24.576 MHz and 12.288 MHz output clock frequencies based on the available 96 MHz, 8 MHz clock or reference clock signals provided as inputs.

The output clock signal generate by clock divider 116 is the REFO output MCLK signal. The MCLK signal is provided to the SRC engine and used to convert the sample rate of the source audio signal 119 by generating an output audio signal 120. The output audio signal 120 can then be provided to audio codec 121 for processing at the updated sample rate. The audio codec 121 may be fully or partly implemented external to the flexible clocking system 100. The MCLK may also be provided to other components via a bus 118 interface, such as an Inter-IC sound or Integrated Interchip Sound bus. In some embodiments MCLK is also provided to the audio codec 120 component of the device where it is used, for instance, in decoding the adjusted sample rate audio signal for playback.

Figure 2:
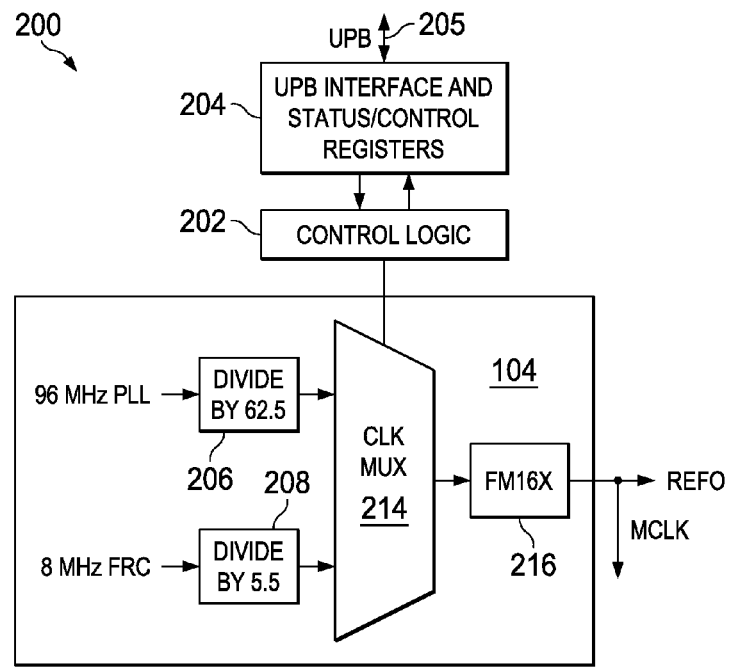
FIG. 2 is a diagram illustrating the clock system of FIG. 1 in greater detail.

FIG. 2 illustrates another embodiment of the MCLK source generation module 104 in greater detail. In this embodiment, the REFI reference signal is not utilized, such that the MCLK source generation module 104 selects from either the clock signals recovered by the PLL 108 or the clock signal generated using the FRC 110. Also in this embodiment, a clock divider 216 is internal to the MCLK source generation module 104. Consequently, the selected clock signal is divided within the MCLK source generation module 104 in order to generate the REFO output clock signal.

System 200 includes portions of the flexible clocking system 100 of FIG. 1, as well as control logic 202 and a bus interface and control register module 204. The control logic 202 interfaces directly with the flexible clocking system provides control signal to multiplexer 214 and multiplexer and clock divider 216. The control signals provided by control logic 202 instruct multiplexer 214 on the selection between the first clock signal and the second clock signal. In some embodiments, the first clock signal selectable per the instructions of control logic 202 is a clock signal recovered by a phase lock loop circuit from a digital data signal according to methods known in the art. In some embodiment, the second clock signal selectable per the instructions of control logic 202 is a clock signal generated by a fast resistor capacitor (FRC) oscillator that is present within the microcontroller. This FRC oscillator is not a crystal oscillator and is instead a sequential logic circuit that can be configured to provide a clock signal of different frequencies. In some embodiments, the bus interface and control register module 204 may be comprised of a Universal Peripheral Bus (UPB) interface for communication over a UPB bus 205.

The MCLK source generation module 104 includes one or more dividers 206, 207 and a clock multiplexer 214. In one embodiment, the MCLK source generation module 104 dividers include a /62.5 divider 206 for receiving inputs from the PLL 108 and generating a 1536 kHz clock, and a /5.5 divider 208 for receiving inputs from the FRC 110 and generating a 1454 kHz clock. These particular dividers allow the generation of 24.576 MHz and 12.288 MHz output clock frequencies based on the available 96 MHz and 8 MHz clocks. For instance, if the 96 MHz clock is selected, the /62.5 divider generates a signal with a frequency of 1536 kHz which is multiplied by 16 by the FM16X divider 216, resulting in a signal with a 24.576 Mhz frequency. Since the 8 MHz clock signal is derived from an FRC 110, its frequency is configurable up to 7%. Consequently, a 5.6% increase to the FRC 110 generates an 8.448 MHz clock signal. If this 8.448 MHz clock signal is selected, the /5.5 divider generates a signal with a frequency of 1536 kHz, which is multiplied by 16 by the FM16X divider 216, resulting in a signal with a 24.576 MHz frequency. In this manner, certain output frequencies can be obtained using either the PLL 108 or the FRC 110. Other output frequencies will be better suited to one clock input or the other, however. The clock multiplexer 214 selects between these two clock inputs based on input from the control logic 202.

Figure 3:
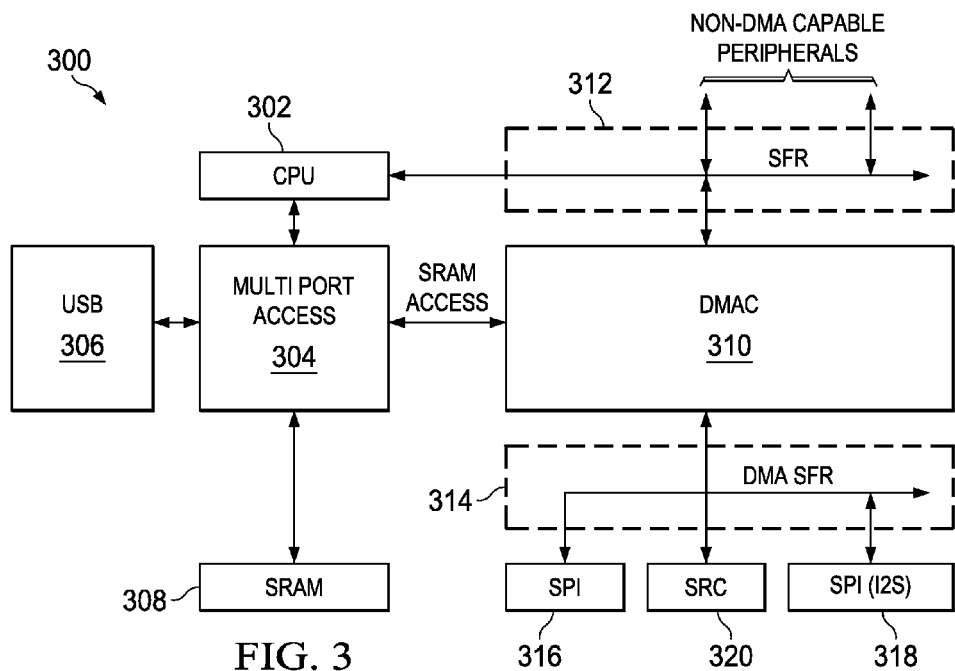
FIG. 3 is a block diagram of an exemplary processor system including a clock system according to embodiments.

FIG. 3 illustrates an exemplary USB device implementing an SRC for the purposes of receiving a source audio signal via a USB coupling and adjusting its sample rate for playback. System 300 includes a central processing unit (CPU) 302. The CPU 302 is connected via a special function register (SFR) bus 312 to one or more non-DMA (Direct Memory Access) capable peripherals. The CPU 302 further couples to a multiport access interface 304 for communication with a Universal Serial Bus (USB) 306. The multiport access interface 304 in turn couples to SRAM 308 and to a DMA controller (DMAC) 310. The DMAC 310 couples, via a DMA SFR bus 314, to one or more sub-systems, such as the sample rate converter (SRC) 310 and to one or more serial peripheral interfaces 316, 318, such as an Integrated Interchip Sound (I2S) interface that can be used to connect to separate digital devices or other integrated circuits within the system.

Figure 4:
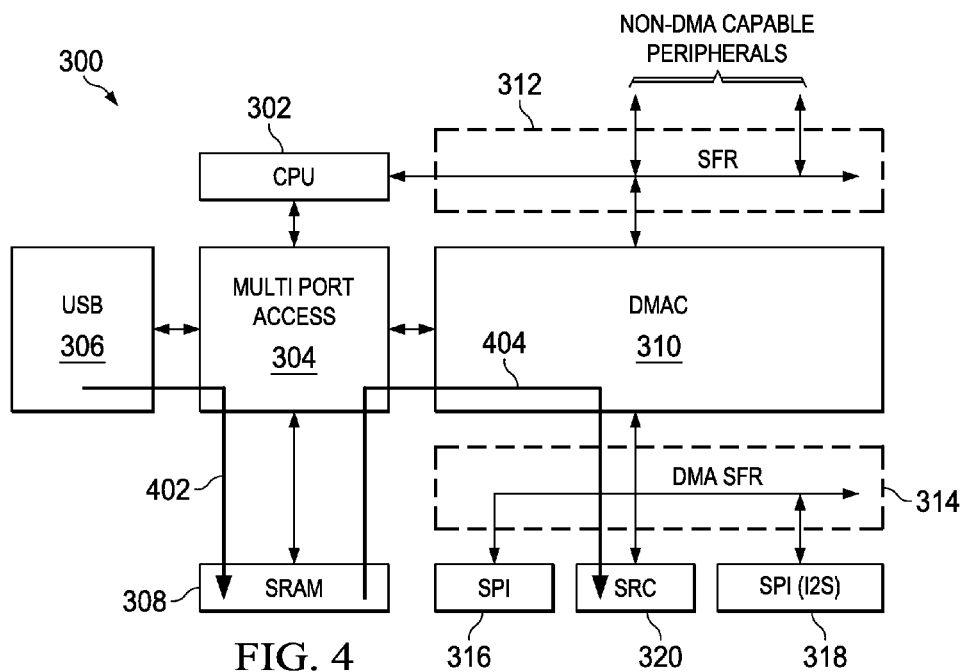
FIG. 4 is a diagram illustrating operation of embodiments.

As noted above, embodiments provide sample rate conversion for streaming audio from a USB source to an audio codec. FIG. 4 schematically illustrates such operation, using the exemplary system of FIG. 3. As shown at 402, source audio data is streamed from an external USB device 306 to SRAM 308 via multiport access interface 304. The source audio data is then provided, as shown at 404, via DMAC 310 to the SRC 320. As described above, if required, the source digital audio data is converted by the SRC 320 to a digital audio signal with a new sample rate. The updated audio signal is then provided to the audio codec where it can be processed at the updated sample rate.

Figure 5:
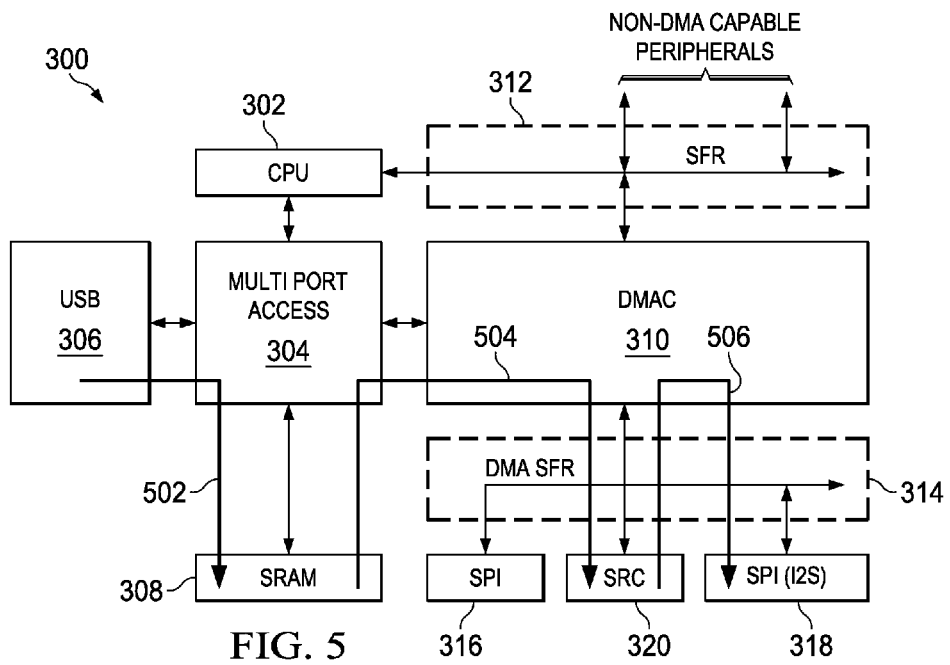
FIG. 5 is a diagram illustrating operation of embodiments.

The system 300 may also couple the USB audio source to an I2S-compatible device 318 via the SRC. This is shown more particularly with reference to FIG. 5. The source audio data is received via the USB coupling 306 and, via multiport access interface 304, is stored to SRAM 308. The source audio data is provided via DMAC 310 to the SRC 320 for sample rate conversion. Once the SRC has converted the sample rate of the source audio, the resampled audio is provided via 506 to DMAC 310 and to external subsystems and devices via the I2S interface 318.

Figure 6:
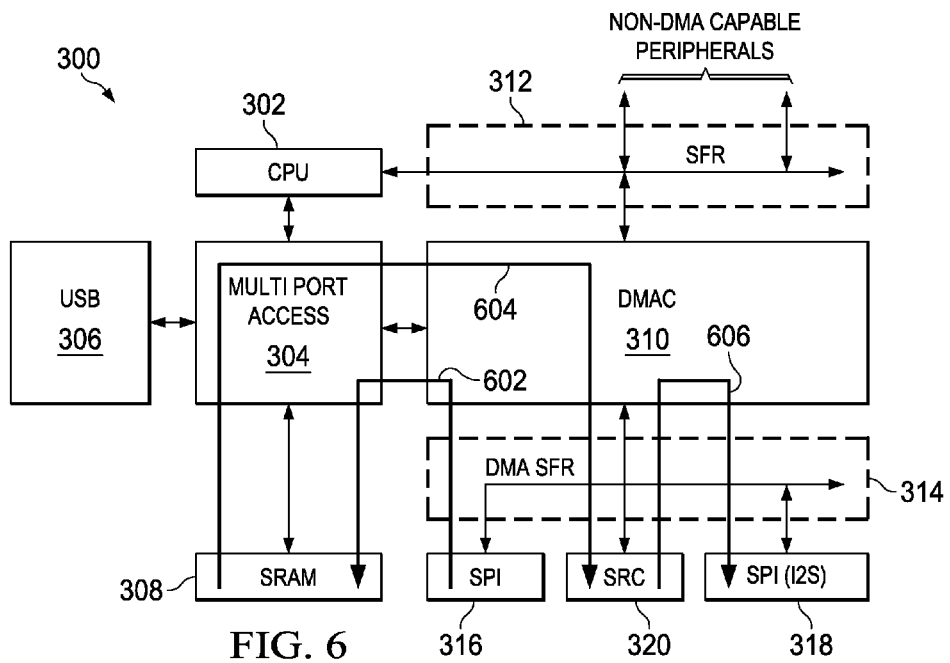
FIG. 6 is a diagram illustrating operation of embodiments.

Additionally, some embodiments allow for data to be streamed from a device providing audio via a Serial Peripheral Interface (SPI) 316 to an I2S-compatible device 318 via the SRC. This is shown more particularly with reference to FIG. 6. In this scenario, the audio source data is provided from an SPI subsystem or device via 602 to SRAM 308. The source audio data is provided via 604 to DMAC 310 and then to the SRC 320 for sample rate conversion. Once the SRC has converted the sample rate of the source audio, the resampled audio is provided via 506 to DMAC 310 and to external subsystems and devices via the I2S interface 318.

The above embodiments illustrate the implementation of flexible clocking for an audio sample rate converter that has the advantage of utilizing existing clock source rather than requiring any dedicated clock generation circuit such as a PLL or a dedicated crystal or ceramic oscillator. Another advantage provided by this flexible clocking system is that it can be used to provide a clock signal to the audio codec in addition to the SRC. This consolidates the clock signal for the SRC and codec into a single signal which reduces manufacturing cost and complexity compared to having separate clock signal generation for the SRC and the audio codec.

Another advantage of the claimed flexible clocking system and sample rate converter is a reduction in jitter and offset in the clock signal utilized by the SRC and audio codec. Even if the source audio signal is sampled at the rate required by the audio codec such that no sample rate conversion is necessary, jitter and offset can still be present and result in a noticeable reduction in audio quality. When streaming audio, the audio signal must arrive at precisely-timed intervals in order for the audio codec to be able to receive and decode the signal without losing any of the sound information. Any audio data that arrives at the audio codec either too late or too early may not get properly converted by the codec and can result in an audible click in place of the missing audio information.

Even if a streamed USB source audio is sampled at the same frequency at which the audio codec is clocked, any discrepancies between the clock used to encode the source audio signal and the clock used by the audio codec can result in jitter, which is especially undesirable in streaming audio applications because information lost due to jitter can result in lost audio signal information that is noticeable by a listener. Information is lost as a result of jitter between the clock used to stream the source audio and the audio codec due to underrun and overrun. clock jitter and offset between the USB and codec systems may result in underrun or overrun. However, by utilizing the flexible clocking scheme, the sampling of the source audio signal, even at the same rate it was originally sampled, generates a more synchronized clock signal and sampled audio signal that can be processed by the audio codec with less jitter.

Although the foregoing specification describes specific embodiments, numerous changes in the details of the embodiments disclosed herein and additional embodiments will be apparent to, and may be made by, persons of ordinary skill in the art having reference to this description. In this context, the specification and figures are to be regarded in an illustrative rather than a restrictive sense, and all such modifications are intended to be included within the scope of this disclosure. Accordingly, the scope of the present disclosure should be determined by the following claims and their legal equivalents.

What is claimed is:

1. A microcontroller comprising:
   an on-chip sample rate converter, wherein the sample rate converter receives a source audio signal that is sampled at a first sampling rate, and wherein the sample rate converter generates an output audio signal sampled at a second sampling rate, and wherein the sample rate converter utilizes a master clock signal in converting the sample rate of the audio signal, and
   a master clock circuit configured to generate the master clock signal wherein the master clock circuit selects from an on-chip system clock signal or a bus interface clock signal and scales the frequency of the selected clock signal to generate the master clock signal with the frequency of the second sampling rate.

2. The microcontroller according to claim 1, wherein the microcontroller further comprises:
   a first circuit configured to provide the bus interface clock signal wherein the bus interface clock signal is recovered from a digital signal.

3. The microcontroller according to claim 2, wherein the first circuit is configured to recover the bus interface clock signal using a phase-lock loop clock recovery circuit.

4. The microcontroller according to claim 3, wherein the bus interface clock signal recovered by the phase-lock loop circuit is a USB infrastructure clock signal.

5. The microcontroller according to claim 1, wherein the microcontroller further comprises:
   a second circuit configured to provide the on-chip system clock signal wherein the on-chip system clock signal is generated by an RC oscillator circuit.

6. The microcontroller according to claim 1, wherein the microcontroller further comprises:
   a third circuit configured to provide a reference clock signal wherein the reference clock signal is recovered from the source audio signal, wherein the a master clock circuit is further configured to generate the master clock signal by selecting from the on-chip system clock signal, the bus interface clock signal or the reference clock signal.

7. The microcontroller according to claim 1, wherein the source audio signal is streaming audio received by the system via a USB interface.

8. The microcontroller according to claim 1, wherein the microcontroller further comprises:
   a bus interface wherein the bus interface is an Integrated Interchip Sound bus that provides the master clock signal to components external to the system.

9. A method for use in a processor, comprising:
   receiving a source audio signal wherein the source audio signal is sampled at a first sampling rate;
   receiving a first clock signal wherein the first clock signal is recovered from a digital signal;
   receiving a second clock signal wherein the second clock signal is generated by an RC oscillator circuit;
   selecting one of the first clock signal or the second clock signal;
   scaling the selected clock signal to generate a master clock signal with the frequency of a second sampling rate;

converting the source audio signal that is sampled at a first sampling rate to an output audio signal sampled at the second sampling rate specified by the master clock signal.

10. The method of claim 9 further comprising:
decoding the output audio signal using the master clock signal to decode the source audio signal at the second sampling rate.

11. The method of claim 9, wherein the first circuit is provided the first clock signal by a phase-lock loop clock recovery circuit.

12. The method of claim 11, wherein the first clock signal provided by the phase-lock loop clock recovery circuit is a USB infrastructure clock signal.

13. The method of claim 9, wherein the source audio signal is streaming audio received by the system via a USB interface.

14. The method of claim 9 further comprising:
providing master clock signal to components external to the system via a bus interface wherein the bus interface is an Integrated Interchip Sound bus.

15. The method of claim 9, wherein the source audio signal is streaming audio received by the system via a Serial Peripheral Interface.

16. A sample rate conversion system comprising:
a sample rate converter wherein the sample rate converter receives a source audio signal that is sampled at a first sampling rate and wherein the sample rate converter generates an output audio signal sampled at a second sampling rate and wherein the sample rate converter utilizes a master clock signal in converting the audio signal;
a clock recovery circuit configured to provide a first clock signal wherein the first clock signal is recovered from a digital signal;
an RC oscillator circuit configured to provide a second clock signal; and
a circuit configured to generate the master clock signal by selecting one of the first clock signal or the second clock signal and configured to scale the frequency of the selected clock signal to generate the master clock signal with the frequency of the second sampling rate.

17. The system according to claim 16, wherein the system further comprises:
an audio codec wherein the audio code uses the master clock signal to decode the source audio signal at the second sampling rate.

18. The system according to claim 16, wherein the clock recovery circuit is provided the first clock signal by a phase-lock loop clock recovery circuit.

19. The system according to claim 18, wherein the first clock signal provided by the phase-lock loop clock recovery circuit is a USB infrastructure clock signal.

20. The system according to claim 16, wherein the source audio signal is streaming audio received by the microcontroller via a USB interface.

* * * * *